(12) United States Patent
Wu

(10) Patent No.: US 6,265,684 B1
(45) Date of Patent: Jul. 24, 2001

(54) WAFER ID OPTICAL SORTING SYSTEM

(75) Inventor: Joseph Wu, Hsinchu Hsien (TW)

(73) Assignees: ProMos Technologies Inc.; Mosel Vitelic Inc., both of Hsinchu (TW); Siemens AG, Munich (DE)

( * ) Notice: Subject to any disclaimer, the term of this patent is extended or adjusted under 35 U.S.C. 154(b) by 0 days.

(21) Appl. No.: 09/429,152

(22) Filed: Oct. 28, 1999

(51) Int. Cl.[7] ............................... B07C 5/00; G06K 9/00; G06K 7/10
(52) U.S. Cl. ......................... 209/583; 209/577; 209/587; 235/462.01; 235/462.11
(58) Field of Search .................................. 209/555, 556, 209/583, 577, 576, 529, 530, 539, 587

(56) References Cited

U.S. PATENT DOCUMENTS

| | | | |
|---|---|---|---|
| 5,175,774 | * | 12/1992 | Truax et al. ............................... 382/8 |
| 5,386,481 | * | 1/1995 | Hine et al. ............................... 382/8 |
| 5,759,006 | * | 6/1998 | Miyamoto et al. ................... 414/416 |
| 5,864,130 | * | 1/1999 | Kahn et al. ............................ 235/462 |
| 5,894,348 | * | 4/1999 | Bacchi et al. ......................... 356/370 |
| 6,027,301 | * | 2/2000 | Kim et al. ............................. 414/416 |

* cited by examiner

*Primary Examiner*—Donald P. Walsh
*Assistant Examiner*—Jonathan R. Miller
(74) *Attorney, Agent, or Firm*—Jiawei Huang; J. C. Patents

(57) ABSTRACT

A wafer ID optical sorting system includes an auto-ID reader, a manual-ID reader and a conveying device, operation of which units is controlled by a monitoring system. The auto-ID reader, connected to the monitoring system, can automatically read and identify an ID and allows the ID to be displayed on the monitoring system. The manual-ID reader, connected to the monitoring system, can fetch the ID image and allows it to be displayed on the monitoring system. The conveying device, connected to the monitoring system, can move the auto-ID reader and the manual-ID reader.

10 Claims, 3 Drawing Sheets

WAFER ID OPTICAL SORTING SYSTEM

BACKGROUND OF THE INVENTION

1. Field of Invention

The present invention relates to an optical sorting system. More particularly, the present invention relates to a wafer ID optical sorting system employed in the semiconductor fabrication process.

2. Description of Related Art

Wafers 10, 20 fabricated in the semiconductor fabrication process each have their own IDs 12, 22, which are located opposite the notch 14 or the flat 24, as shown in FIG. 1. The IDs 12, 22 contain a lot number and a barcode, and are formed on the wafers 10, 20 by a laser. The IDs 12, 22 of each wafer 10, 20 are different from each other to allow easy recognition of the wafers 10, 20.

When an entire lot of wafers has completed a semiconductor fabrication process, sometimes a portion of the wafers does not meet the process requirements for, for example, film deposition or removal of photoresist. Therefore, a sorter machine with an auto ID reader is used to recognize automatically the ID of the wafer, such that trouble shooting can be performed. However, the auto ID reader may fail to read the ID when the photoresist or the material formed on the ID cannot be completely exposed or etched in such processes as wafer edge exposure or edge clamp process variation, resulting in wafer edge color difference. These various imperfections render the auto ID reader unable to clearly identify the ID.

In addition, if the ID is retrieved from the chamber and then identified by the naked eye, the wafer ID cannot be clearly recognized and the wafer is easily contaminated with particles. Additionally, the larger the wafer is, the more difficult it is to draw out and store, so that it is necessary to pay more attention to prevent the wafer from falling when the wafer is in operation. Accordingly, the cycle time in operation is increased and performance is decreased.

SUMMARY OF THE INVENTION

The invention provides a wafer ID optical sorting system to successfully identify the wafer ID of a semiconductor wafer.

As embodied and broadly described herein, the invention provides a wafer ID optical sorting system including an auto-ID reader, a manual-ID reader and a conveying device, operation of which units is controlled by a monitoring system. The auto-ID reader, connected to the monitoring system, can automatically read and identify an ID and allows the ID to be displayed on the monitoring system. The manual-ID reader, connected to the monitoring system, can fetch the ID image and allows it to be displayed on the monitoring system. The conveying device, connected to the monitoring system, can move the auto-ID reader and the manual-ID reader. The auto-ID reader includes an ID reader and a first charge coupled device, the manual-ID reader includes an optical magnifying device and a second charge coupled device, and the monitoring system includes a monitor and a control panel.

The invention provides a method of identifying a wafer ID. A wafer is moved from a cassette to an auto-ID reader by way of the conveying system, and the auto-ID reader is used to identify the ID of the wafer. When the ID cannot be successfully identified by the auto-ID reader, the wafer is then moved from the auto-ID reader to a manual-ID reader by the conveying system. The manual-ID reader fetches the ID image, which is displayed by a monitoring system. Thereafter, the wafer is returned to the cassette by the conveying device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The preferred embodiment of the invention utilizes an auto-ID reader and a manual-ID reader to perform a process of identifying a wafer ID so that the manual-ID reader can continuously perform such process as the auto-ID reader does not successfully identify the wafer ID. Therefore, the wafer ID can be clearly identified and the wafer can be prevented from being contaminated.

Figure 1:
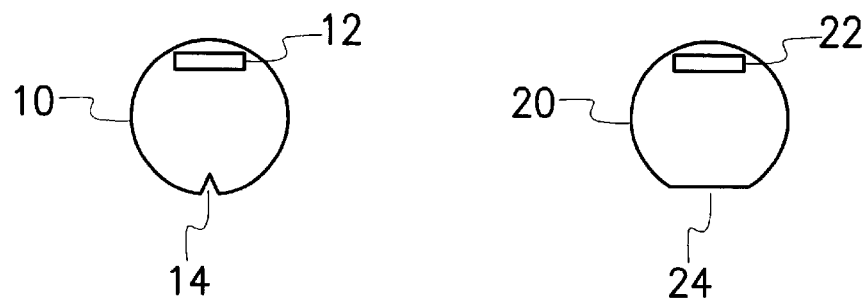
FIG. 1 is schematic, top view illustrating the corresponding position of a wafer ID on wafer.
Figure 2:
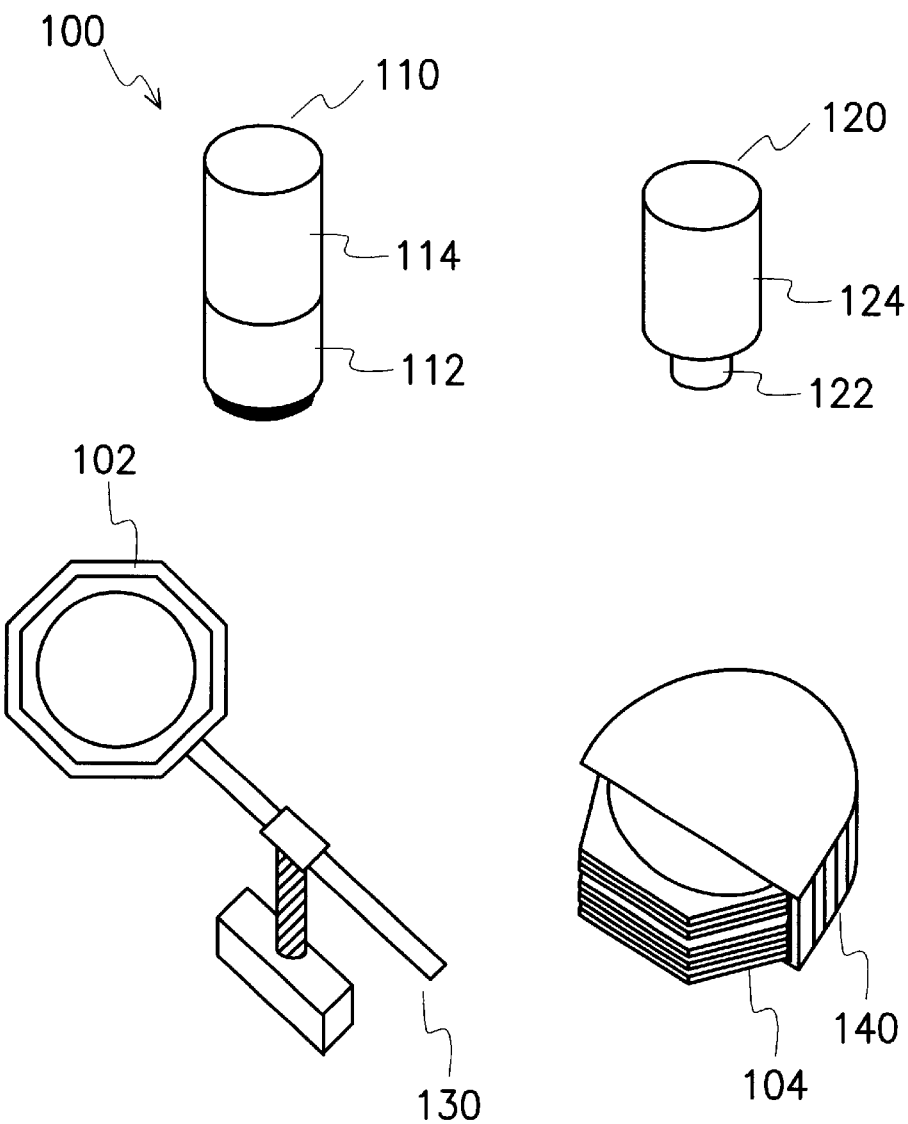
FIG. 2 is schematic view illustrating a wafer ID optical sorting system according to one preferred embodiment of this invention.
Figure 3:
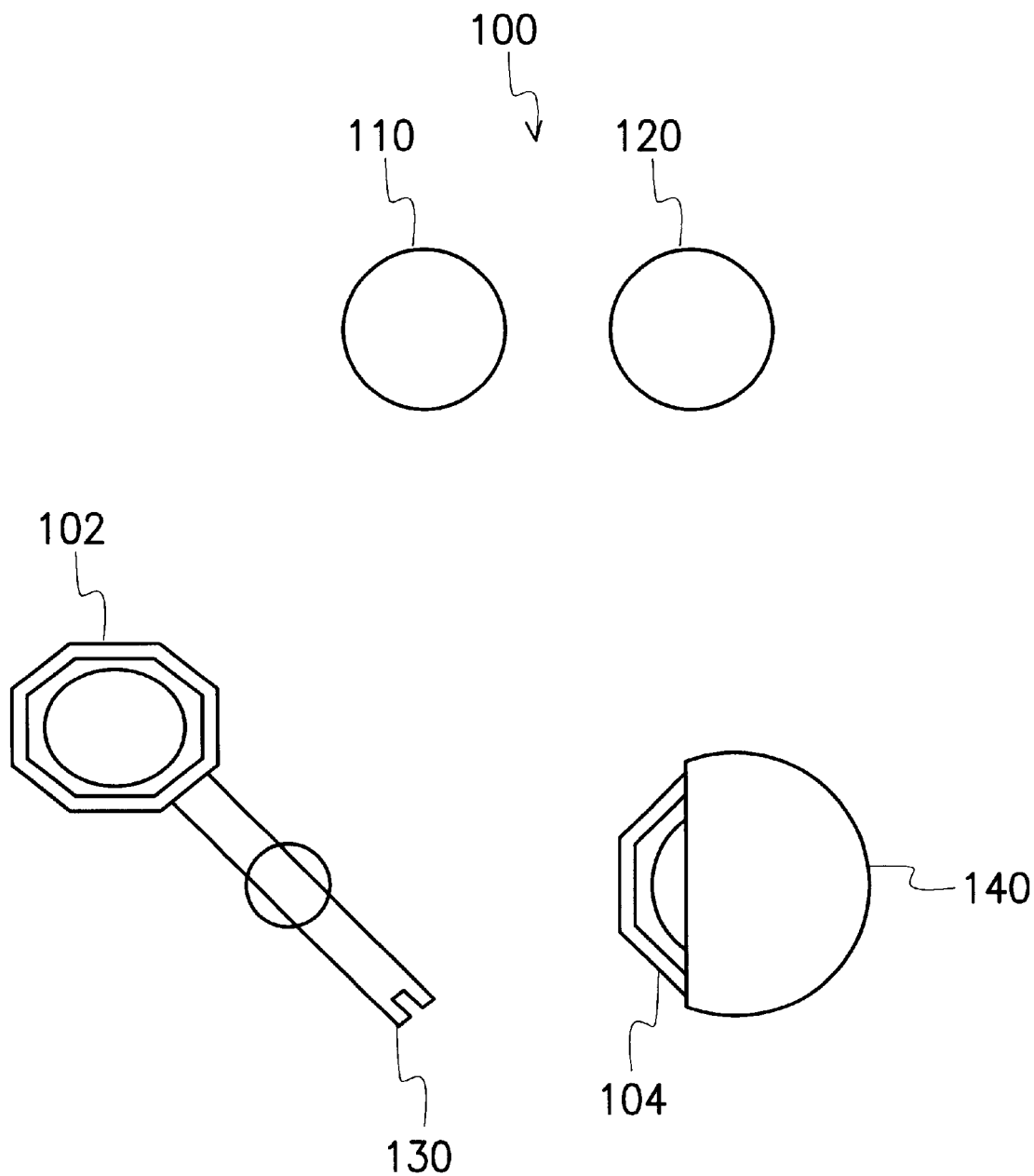
FIG. 3 is schematic, top view illustrating a wafer ID optical sorting system according to FIG. 2.
Figure 4:
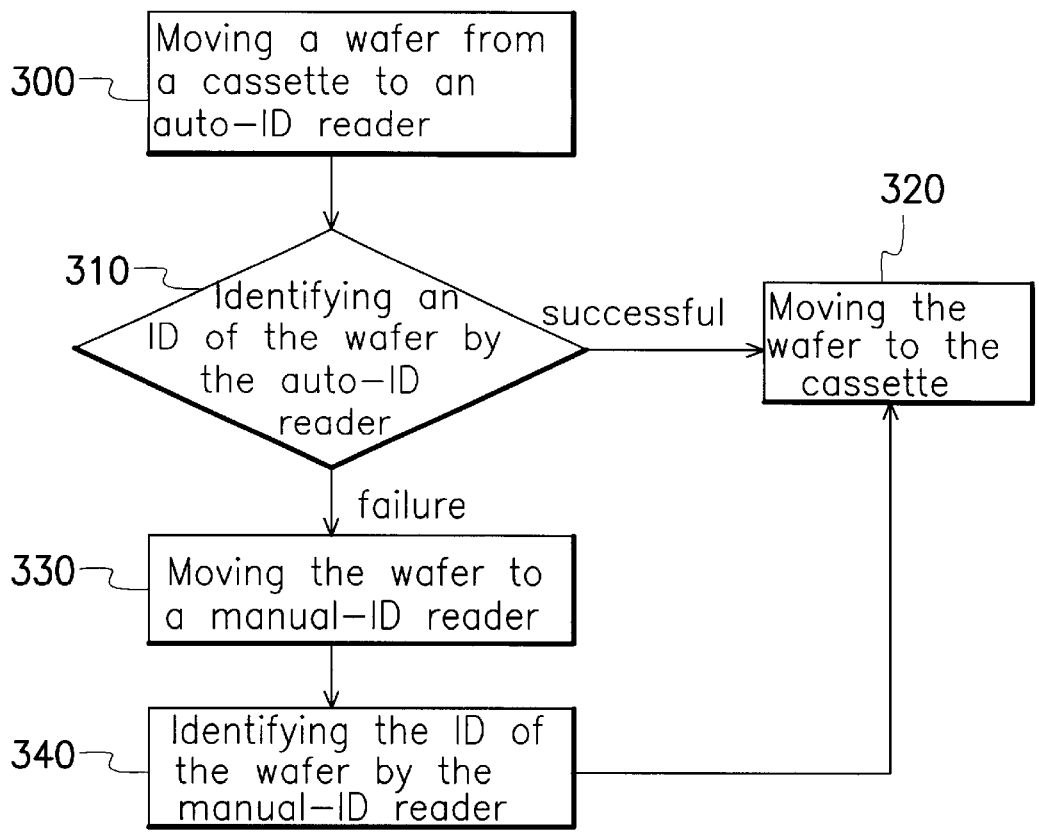
FIG. 4 is a flow chart illustrating a wafer ID identifying process performed by a wafer ID optical sorting system according to one preferred embodiment of this invention.
Figure 5:
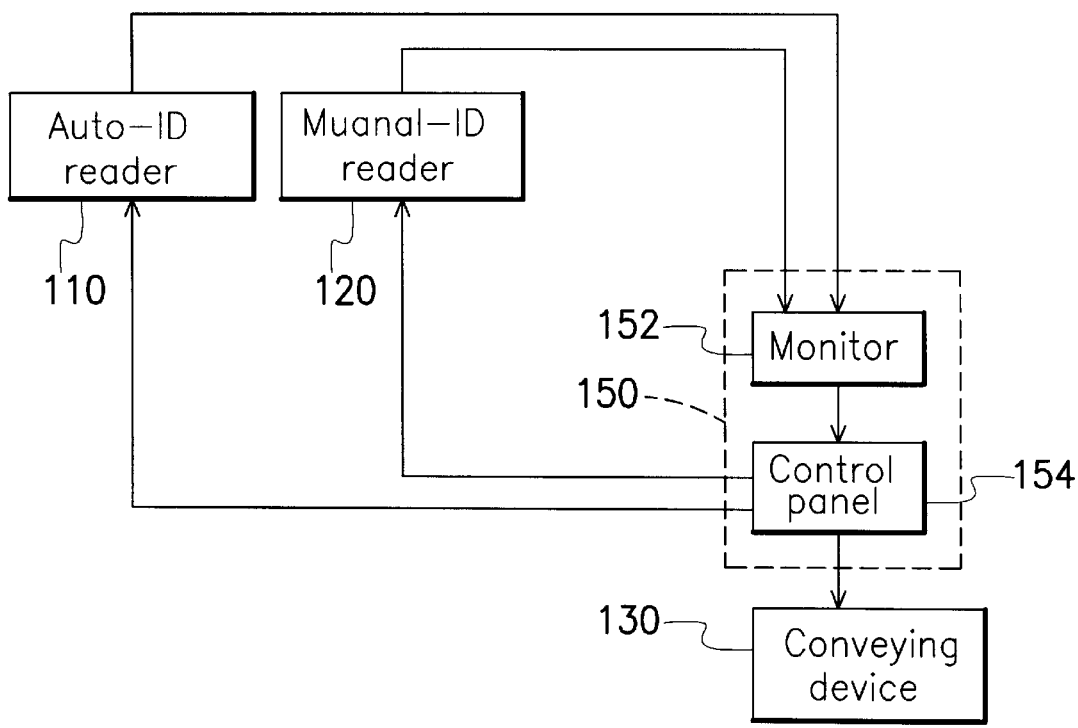
FIG. 5 is a block diagram of a wafer ID optical sorted system according to one preferred embodiment of this invention.

FIG. 2 is schematic view illustrating a wafer ID optical sorting system according to one preferred embodiment of this invention, and FIG. 3 is schematic, top view illustrating a wafer ID optical sorting system according to FIG. 2. FIG. 4 shows a flow chart illustrating a process of identifying a wafer ID performed by a wafer ID optical sorting system, and FIG. 5 is a block diagram of a wafer ID optical sorted system according to one preferred embodiment of this invention. Referring to FIG. 2 and FIG. 3, a wafer ID optical sorting system includes an auto-ID reader 110, a manual-ID reader 120, a conveying device 130 and a cassette 140. The auto-ID reader 110 further contains an ID reader 112 and a first charge coupled device (CCD) 114. The ID reader 112 is used to automatically identify the ID of the wafer; for example, the ID reader 112 fetches optical signals from the ID and then transforms such optical signals into electronic signals by way of the first charge coupled device 114, so that signals identified by the auto-ID reader 110 can be obtained and displayed. The manual-ID reader 120 includes an optical magnifying device 122, such as a microscope, and a second charge coupled device 124. The optical magnifying device 122 is used, for example, to fetch and magnify the ID image, and then followed by transforming optical signals into electronic signals using the second charge coupled device 124. Accordingly, the monitor is able to display the ID image after receiving electronic signals. The conveying device 130 can be a robot, for example, to carry the wafer, and the cassette 140 is used to store wafers 104.

Referring to FIG. 4 and FIG. 5, a monitoring system 150 including a monitor 152 and a control panel 154 controls operation of the conveying device 130. The conveying device 130 retrieves the wafer 102 from the cassette 140 and sends it to the ID reader 112 underneath the auto-ID reader 110 (step 300). The monitoring system 150 commands the auto-ID reader 110 to align with the wafer 102 and an attempt is made by auto-ID reader 110 to identify the ID (step 310). After signals are received by the first charge coupled device 114, the ID is then displayed on the monitor 152. When the monitor 152 shows that the ID has been successfully identified, the conveying device 130 is commanded by the control panel 154 to return the wafer 102 back to the cassette 140 (step 320). Subsequently, the IDs of the wafers 104 in the cassette 140 are successively identified.

However, if the monitor 152 shows that the auto-ID reader cannot successfully read the ID of the wafer 102, the control panel 154 stops operation of the auto-ID reader 110 and commands the conveying device 130 to move the wafer 102. Accordingly, the wafer 102 is moved from the auto-ID reader 110 to the manual-ID reader (step 330) and aligned with the manual-ID reader 120. Thereafter, the manual-ID reader 120 is operated by the control panel 154, and the ID is manually read using the optical magnifying device 122 (step 340), which can be a low magnification microscope or magnifying glass. Manually reading the ID is performed by, for example, magnifying the ID image by the optical magnifying device 122, followed by transmitting the ID image, which ID image has been treated by the second charge coupled device 124, to the monitor 152 of the monitoring system 150. Thus, the magnified ID image displayed on the monitor 152 can be read and noted by operators. After the monitor 152 successfully displays the ID image, the control panel 154 stops operation of the manual-ID device 120, and the conveying device 130 is commanded to return the wafer 102 to the cassette 140 (step 320).

This preferred embodiment of the invention uses the manual-ID reader to fetch the ID image when the auto-ID reader fails to read the ID. Since the manual-ID reader utilizes an optical magnifying device to magnify the ID image and displays the same on the monitor, reading the ID of the wafer becomes easier and opportunity to successfully identify the ID is increased.

In addition, the ID can be successfully identified without retrieving the wafer from the chamber and thus the wafer can be protected from being contaminated and falling. As a result, the operation time can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An identifying system to recognize an ID on a wafer, comprising:

a monitoring system, to monitor and control the system operation;

an auto-ID reader, connected to the monitoring system to automatically identify the ID;

a manual-ID reader, connected to the monitoring system to obtain an optical image of the ID which is transmitted to the monitor to be displayed; and a conveying device, commanded by the monitoring system to move the wafer of which the ID cannot be read by the auto-ID reader to the manual-ID reader to capture the optical image of the ID.

2. The system according to claim 1, wherein the auto-ID reader further includes:

an ID reader to capture optical signals that identify the ID of the wafer directly; and a first charge coupled device to transform the optical signals captured by the ID reader into electronic signals.

3. The system according to claim 1, wherein the manual-ID reader includes:

an optical magnifying device to magnify optical signals of the optical image of the ID of the wafer; and a second charge coupled device to transform the optical signals into electronic signals.

4. The system according to claim 1, wherein the monitoring system includes:

a monitor to display the ID identified by the auto-ID reader and to read the ID from the optical image of the ID captured by the manual-ID reader; and a control panel to control operation of the conveying device, the auto-ID reader and the manual-ID reader.

5. The system according to claim 1, wherein the conveying device includes a robot.

6. A method of identifying an ID of a wafer, comprising:

controlling a conveying device to convey a wafer from a cassette to an auto-ID reader by a monitoring system and performing an identifying step to identify the ID of the wafer by the auto-ID reader;

stopping identifying the ID of the wafer when the monitoring system displays that the ID cannot be read by the auto-ID reader, and moving the wafer from the auto-ID reader to a manual-ID reader by the conveying device, and then using the manual-ID reader to obtain an optical image of the ID; and stopping the manual-ID reader when the monitoring system displays the optical image of the ID and using the conveying device to move the wafer from the manual-ID reader to the cassette.

7. The method according to claim 6, wherein the conveying device includes a robot.

8. The method according to claim 6, further comprising a step of manually noting the ID when the monitoring system displays the ID image.

9. The method according to claim 6, wherein the auto-ID reader includes an ID reader and a first charged coupled device.

10. The method according to claim 6, wherein the manual-ID reader includes an optical magnifying device and a second charged coupled device.

* * * * *